United States Patent [19]

Wislocky et al.

[11] 4,358,784
[45] Nov. 9, 1982

[54] CLAD MOLYBDENUM DISKS FOR ALLOYED DIODE

[75] Inventors: Joseph Wislocky, El Segundo; Thomas J. Roach, Rancho Palos Verdes, both of Calif.

[73] Assignee: International Rectifier Corporation, Los Angeles, Calif.

[21] Appl. No.: 98,850

[22] Filed: Nov. 30, 1979

[51] Int. Cl.³ .................. H01L 23/48; H01L 29/46; H01L 29/54
[52] U.S. Cl. ........................ 357/71; 357/65; 357/68
[58] Field of Search .................. 357/65, 68, 71

[56] References Cited

U.S. PATENT DOCUMENTS

| | | | |
|---|---|---|---|
| 2,854,612 | 9/1958 | Zaratkiewicz | 357/71 |
| 3,093,882 | 6/1963 | Emeis | 357/71 |
| 3,184,823 | 5/1965 | Little et al. | 357/71 |
| 3,184,824 | 5/1965 | Fairbairn | 357/71 |
| 3,447,236 | 6/1969 | Hatcher | 357/71 |
| 3,566,209 | 2/1971 | Shaw | 357/71 |
| 3,620,692 | 11/1971 | Franklin | 357/71 |
| 4,096,510 | 6/1978 | Arai et al. | 357/71 |

FOREIGN PATENT DOCUMENTS 45-32008  11/1970  Japan .................. 357/71

Primary Examiner—Andrew J. James
Attorney, Agent, or Firm—Ostrolenk, Faber, Gerb & Soffen

[57] ABSTRACT

An alloyed diode is formed of a silicon wafer which is sandwiched between two pre-clad molybdenum disks. The upper molybdenum disk is clad on the side facing the silicon wafer with a thin aluminum foil and is clad on its outer surface with a nickel foil. The bottom molybdenum is clad with a solder foil of silver containing small amounts of germanium, copper and arsenic on the surface facing the silicon and is clad with nickel on its opposite surface. The three parts are stacked atop one another and placed in an alloying furnace to form a completed semiconductor wafer with solderable electrodes on opposite sides.

6 Claims, 4 Drawing Figures

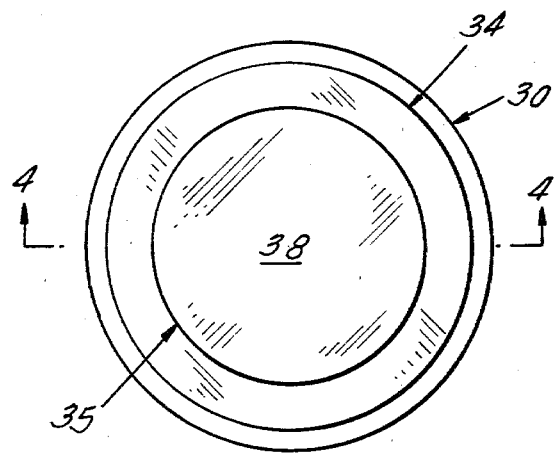
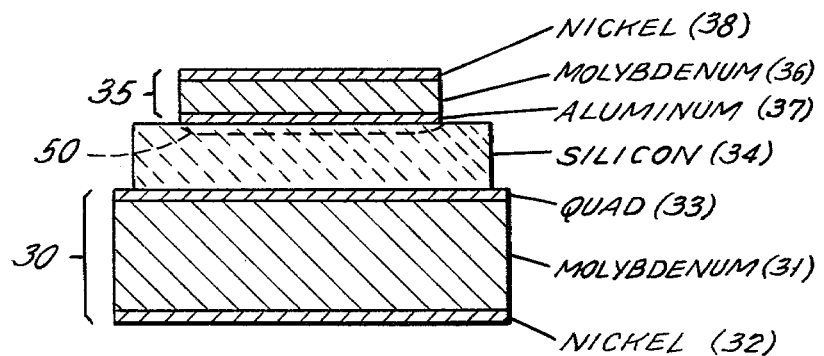

CLAD MOLYBDENUM DISKS FOR ALLOYED DIODE

BACKGROUND OF THE INVENTION

This invention relates to semiconductor devices, and more specifically relates to a novel article and process for manufacturing an alloyed diode.

Semiconductor devices are commonly made by either alloying or diffusing a junction into a silicon wafer. Devices made by the alloyed process are less expensive than those made by the diffusion process since the manufacturing equipment and process is much simpler. The alloyed device, however, usually has a lower blocking voltage than those made by a diffusion process but this blocking voltage may still be as high as about 1200 volts. Thus, devices made by an alloying process are suitable for many applications such as in power supplies for welders and the like where relatively low voltage devices can be used, and where cost is a principal element in the choice of the device to be used.

The process now used for the manufacture of an alloyed diode requires the handling and stacking of a large number of thin foils. Foils are very difficult to handle and are virtually impossible to be used in an automated process. Thus, a great deal of hand labor is necessary.

In the conventional process, a thin aluminum foil is stacked against one surface of an N type silicon wafer. At the same time, the molybdenum electrodes are stacked on the opposite surfaces of the silicon. Very thin foils of material which enable soldering to the molybdenum members are placed between one molybdenum member and the silicon and on opposite surfaces of the molybdenum. All members are secured together and the aluminum is alloyed into the silicon during a heating operation.

The thin solder foils may be of any desired type and typically can be foils of material known as a "quad" material which is an alloy consisting principally of silver containing about 2.9% by weight of germanium, 5% by weight of copper and 0.05 to 0.1% by weight of arsenic. These quad foils are disposed on the outer surfaces of the molybdenum and are disposed between the bottom molybdenum electrode and the bare silicon surface on the opposite side of the surface receiving the aluminum layer.

The quad foils which are used in this process are very thin, for example, 1 to 2 mils. Similarly the aluminum is thin and may be about 4.5 mils thick. These foils are not easily handled and the stack of the numerous foils along with the molybdenum expansion electrodes and the silicon wafer cannot be easily automated.

BRIEF DESCRIPTION OF THE INVENTION

In accordance with the present invention and in order to substantially reduce the number of thin foils and parts which need be handled in the manufacturing process for making an alloyed diode, the expansion electrodes, which are conventionally of molybdenum but can be of any other materials such as tungsten or the like, are provided with integrally clad outer layers to replace the thin separate foils which were previously used. Thus, the molybdenum expansion electrodes are clad on their surfaces facing the silicon wafer with an aluminum foil and a quad foil respectively. The opposite surfaces of the expansion electrodes are clad with thin nickel foils or with foils of other materials which are easily wet in a soldering operation during which the molybdenum electrodes are soldered down to main electrodes within the housing which contains the semiconductor assembly.

The cladding operation is a conventional cladding operation using pressure and heat and the molybdenum expansion electrodes are clad before the electrodes are easily assembled and placed in an alloying furnace.

A conventional alloying process is then carried out in the simple alloying furnace. By pre-cladding the expansion electrodes with various thin metal foils, it will be apparent that the task of handling the numerous foils of the prior art is now reduced to the handling of three relatively rigid parts; the upper and lower expansion electrodes which have been pre-clad and the central silicon wafer. Thus, the process is substantially simplified and can now be automated by relatively simple automatic machinery which can automatically feed the components into suitable alloying fixtures without the intervention of operating personnel.

BRIEF DESCRIPTION OF THE DRAWINGS

FIG. 3 is a top view of the completed alloyed device which is produced after the alloying operation in the fixture of FIG. 2.

FIG. 4 is a cross-sectional view of FIG. 3 taken across the section lines 4—4 in FIG. 3.

DETAILED DESCRIPTION OF THE INVENTION

Figure 1:
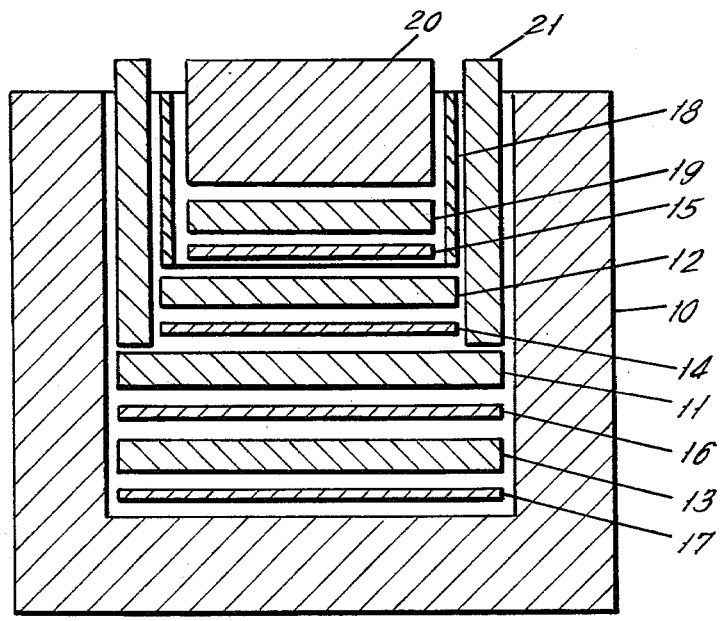
FIG. 1 illustrates a stack of foils, molybdenum electrodes and a silicon wafer in an alloying fixture as in the prior art.

Referring first to FIG. 1, there is illustrated a prior art assembly of components used to make an alloyed device and the alloying fixture which is used to move the assembly into an alloying furnace. The fixture includes a cylindrical graphite container 10 which has an outer diameter sufficient to receive the outer diameter of the components to be assembled. The components include a central N type silicon wafer 11 which may have any desired thickness, for example, 10 mils and molybdenum expansion plates 12 and 13 which can have thicknesses, for example, of 0.010 and 0.040 inch, respectively. An aluminum foil 14 having a thickness of about 0.004 inch is assembled between the silicon wafer 11 and the molybdenum disk 12 and quad foils 15, 16 and 17 are assembled as shown, with the quad foil 15 atop molybdenum disk 12 and quad foils 16 and 17 on the opposite sides of molybdenum disk 13.

The diameter of the quad foil 15 is reduced as compared to the diameter of expansion plate 12 and the foil 15 is centered by a centered steel sleeve 18 which sits atop the outer periphery of disk 12. The quad foil 15 is stepped back to eliminate the possibility of runover during the alloying operation.

A graphite disk 19 is stacked atop the quad foil 15 and a steel weight 20 is placed atop the graphite disk 19. The graphite disk 19 is used to prevent the quad foil from adhering to the steel mass 20 during the alloying operation.

A sleeve 21 of graphite is also provided in order to center the sleeve 18, molybdenum plate 12 and aluminum disk 14 on the silicon wafer 11 as shown.

It will be seen that the assembly operation requires the individual handling of very thin foils. Thus, the assembly operation is not easily subject to production using automated equipment.

Figure 2:
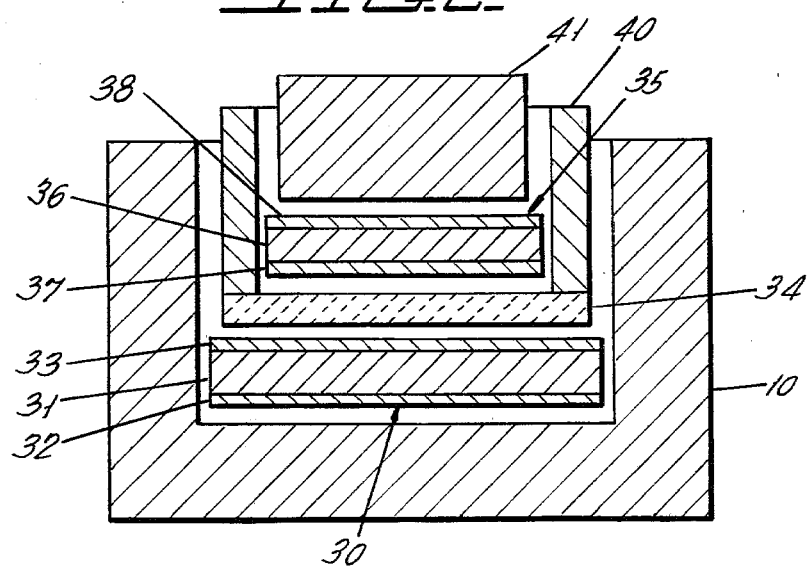
FIG. 2 illustrates the stack of components constructed in accordance with the present invention assembled within an alloying fixture.

In accordance with the present invention and as shown in FIG. 2, the molybdenum expansion plates of FIG. 1 are pre-clad with the necessary thin foils which are to appear on their surfaces so that the number of parts and number of foils which must be handled during the assembly operation in the fixture are greatly reduced. Thus automated techniques can be used to make the device.

Referring to FIG. 2, a lower expansion plate assembly 30 is provided consisting of a molybdenum disk 31 which has been pre-clad on its bottom with a nickel foil 32 and on its top with a nickel foil 33.

In a typical assembly, the assembly 30 may have a diameter of 0.750 inch, the molybdenum portion 31 may have a thickness of 0.040 inch, the lower nickel cladding 32 may have a thickness of about 0.001 inch and will be of pure nickel, and the upper cladding may have a thickness of about 0.002 inch and is a quad material. The layers 32 and 33 are clad by any desired well-known process.

Thereafter, the fixture 10 receives the silicon disk shown as disk 34 which may be identical to the N type disk 11 of FIG. 1. Disposed atop the silicon disk 34 is a second pre-clad assembly 35 which consists of a central molybdenum disk 36 which is pre-clad with an aluminum clade layer 37 on the side facing silicon 34 and a pure nickel layer 38 clad on its opposite side. The diameter of subassembly 35 is about 0.625 inch. The molybdenum disk 36 may have a thickness of about 0.010 inch while the aluminum 37 may have a thickness of about 0.004 inch. The upper nickel cladding 38 will have a thickness of about 0.001 inch.

The subassembly 35 is centered on the silicon disk 34 by a graphite centering ring 40 and a weight 41 which may be of steel if placed directly atop the nickel clad layer 38. Note that an intermediate graphite layer is not necessary since the nickel will not melt during the alloying operation. In FIG. 1 the intermediate graphite 19 was necessary since the quad 15 tends to melt during the alloying.

In assembling the components in the fixture 10 in FIG. 2, a total of only five parts are used including subassemblies 30 and 35, silicon disk 34, graphite sleeve 40 and steel weight 41. This is in contrast to the assembly of eleven separate parts in the prior art arrangement of FIG. 1 wherein some of those parts are very thin foils which are extremely difficult to handle.

After assembly in the fixture of FIG. 2, the fixture is placed in a suitable alloying furnace. In the alloying furnace, the components are heated from room temperature to a temperature of about 875° C. in about 10 minutes. Thereafter, the fixture is removed from the furnace and permitted to cool to room temperature as in conventional alloying operations. The resulting device is that shown in FIGS. 3 and 4 where it is seen that the aluminum layer 37 alloys into the silicon to form the PN junction 50.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. An alloyed diode device comprising a silicon wafer; first and second pre-clad expansion plates of metal having respective first and second parallel surfaces and having respective coefficients of expansion similar to that of said silicon; said first expansion plate having first and second solder foils pre-clad thereto and extending over the full areas of said first and second surfaces respectively of said first expansion plate; said second expansion plate having a third solder foil pre-clad to said first surface thereof and a fourth foil of a predetermined impurity type for producing a rectifying junction in said silicon wafer pre-clad to said second surface of said second plate; said third and fourth foils extending over the full areas of said first and second surfaces respectively of said second expansion plate; said silicon wafer disposed between said first and second pre-clad expansion plates; said first solder foil of said first expansion plate soldering said first expansion plate to one surface of said silicon wafer; said fourth foil being alloyed into the opposite surface of said silicon wafer.

2. The alloyed diode of claim 1 wherein said expansion plates are of molybdenum.

3. The alloyed diode of claim 1 wherein said first and third foils are of nickel and said second foil is of a quad alloy.

4. The alloyed diode of claim 1 wherein said fourth foil is of aluminum.

5. The alloyed diode of claim 2 wherein said first and third foils are of nickel and said second foil is of a quad alloy.

6. The alloyed diode of claim 5 wherein said fourth foil is of aluminum.

* * * * *